US006943429B1

(12) United States Patent
Glenn et al.

(10) Patent No.: US 6,943,429 B1
(45) Date of Patent: Sep. 13, 2005

(54) WAFER HAVING ALIGNMENT MARKS EXTENDING FROM A FIRST TO A SECOND SURFACE OF THE WAFER

(75) Inventors: Thomas P. Glenn, Gilbert, AZ (US); Roy Dale Hollaway, Chandler, AZ (US); Steven Webster, Chandler, AZ (US)

(73) Assignee: Amkor Technology, Inc., Chandler, AZ (US)

( * ) Notice: Subject to any disclaimer, the term of this patent is extended or adjusted under 35 U.S.C. 154(b) by 550 days.

(21) Appl. No.: 09/803,084

(22) Filed: Mar. 8, 2001

(51) Int. Cl.[7] ............... H01L 27/01; H01L 23/12; H01L 27/04; B23K 26/00
(52) U.S. Cl. ............... 257/620; 257/797; 257/618; 257/226; 257/59; 257/72; 257/644; 257/650
(58) Field of Search .................. 257/797, 620, 257/618, 226, 59, 72, 644, 650; 438/107

(56) References Cited

U.S. PATENT DOCUMENTS

| | | | | |
|---|---|---|---|---|
| 5,362,681 | A | * 11/1994 | Roberts et al. | 438/464 |
| 5,777,392 | A | * 7/1998 | Fujii | 257/797 |
| 5,888,884 | A | 3/1999 | Wojnarowski | 438/462 |
| 6,071,656 | A | * 6/2000 | Lin | 430/22 |
| 6,102,775 | A | * 8/2000 | Ushio et al. | 451/6 |
| 6,132,910 | A | * 10/2000 | Kojima | 430/22 |
| 6,151,120 | A | * 11/2000 | Matsumoto et al. | 356/399 |
| 6,151,344 | A | 11/2000 | Kiely et al. | 372/38 |
| 6,275,277 | B1 | * 8/2001 | Walker et al. | 349/113 |
| 6,316,334 | B1 | * 11/2001 | Sivilotti et al. | 438/462 |
| 6,340,547 | B1 | * 1/2002 | Chen et al. | 430/22 |
| 6,407,360 | B1 | * 6/2002 | Choo et al. | 219/121.67 |
| 6,420,776 | B1 | * 7/2002 | Glenn et al. | 257/620 |
| 6,421,456 | B1 | * 7/2002 | Son et al. | 382/145 |
| 6,441,504 | B1 | * 8/2002 | Glenn et al. | 257/797 |
| 6,465,329 | B1 | * 10/2002 | Glenn | 438/462 |
| 6,476,415 | B1 | * 11/2002 | Walker et al. | 257/59 |
| 6,492,189 | B1 | * 12/2002 | Yamaguchi | 438/18 |
| 6,528,393 | B2 | * 3/2003 | Tao | 438/460 |
| 6,537,836 | B2 | 3/2003 | Summerer | 438/16 |
| 2001/0040224 | A1 | * 11/2001 | Matsumoto | 250/548 |
| 2002/0031899 | A1 | * 3/2002 | Manor | 438/460 |
| 2003/0054588 | A1 | * 3/2003 | Patel et al. | 438/107 |
| 2003/0140514 | A1 | * 7/2003 | Fu | 33/645 |

FOREIGN PATENT DOCUMENTS

| | | | |
|---|---|---|---|
| JP | 60-42846 | * | 3/1985 |
| JP | 7-273069 | * | 10/1995 |
| JP | 2003/188263 | * | 7/2003 |

* cited by examiner

Primary Examiner—Alexander Oscar Williams
(74) Attorney, Agent, or Firm—Gunnison, McKay & Hodgson, L.L.P.; Serge J. Hodgson (57) ABSTRACT

A marked wafer includes a front-side surface and a back-side surface. A vertical scribe line and a horizontal scribe line are on the front-side surface of the wafer. A back-side alignment mark is located at an intersection of the vertical scribe line and the horizontal scribe line. The back-side alignment mark extends from the front-side surface to the back-side surface of the wafer. The back-side alignment mark is used to aligning a saw, which singulates the wafer from the back-side surface.

30 Claims, 4 Drawing Sheets

WAFER HAVING ALIGNMENT MARKS EXTENDING FROM A FIRST TO A SECOND SURFACE OF THE WAFER

FIELD OF THE INVENTION

The present invention relates generally to electronic packaging. More particularly, the present invention relates to a marked structure such as a wafer.

BACKGROUND OF THE INVENTION

As is well known to those of skill in the art, integrated circuits, i.e., electronic components, were fabricated in an array on a wafer. The wafer was then cut, sometimes called diced, to singulate the integrated circuits from one another.

Generally, the width of the scribe lines, which delineated the integrated circuits, was sufficient to accommodate the width of the saw cut plus tolerance in the positioning of the saw blade. Stated another way, the width of the scribe lines was sufficiently large such that the saw cut made by the saw blade was always within a scribe line.

When singulating the wafer from the front-side surface of the wafer, the saw blade was directly aligned with the scribe lines, which were visible to the operator and alignment system. Since the scribe lines were used directly to align the saw blade, the saw blade was aligned to the scribe lines to within tight tolerance. Accordingly, the scribe lines were relatively narrow and, more particularly, were only slightly wider than the saw blade. To illustrate, the width of the scribe lines was within the range of 0.002 inches (0.051 mm) to 0.008 inches (0.203 mm).

In certain instances, it was important to protect the front-side surface of the wafer during sawing, e.g., from shards and particulates generated during sawing. To protect the front-side surface, the wafer was sawed from the back-side surface of the wafer.

More particularly, to protect the front-side surface of the wafer, the front-side surface was attached to a tape. The tape supported the wafer during sawing.

The saw blade was aligned with the scribe lines on the front-side surface of the wafer using a two-step process. First, the tape was aligned with the scribe lines. The front-side surface of the wafer was attached to the tape. The tape had area greater than the area of the front-side surface such that the tape had an exposed region, which extended beyond the wafer.

The tape had alignment marks in the exposed region of the tape. As an example, see alignment holes 30a and 30b of Roberts, Jr. et al., U.S. Pat. No. 5,362,681, which is herein incorporated by reference in its entirety. In the above manner, the scribe lines were aligned with the alignment marks of the tape.

Second, the saw blade was aligned with the alignment marks of the tape. The wafer was then sawed with the saw blade from the back-side surface of the wafer. However, since the saw blade was aligned indirectly to the scribe lines using the alignment marks of the tape, a large tolerance was associated with the alignment of the saw blade to the scribe lines.

To accommodate this large tolerance, each of the scribe lines had a relatively large width. More particularly, the width of the scribe lines of the wafer designed to be cut from the back-side surface was significantly larger than the width of the scribe lines of the wafer designed to be cut from the front-side surface. To illustrate, the width of the scribe lines of the wafer designed to be cut from the back-side surface was approximately 0.012 inches (0.305 mm) or more.

Disadvantageously, forming the scribe lines with a relatively large width resulted in less integrated circuits for any given size wafer, i.e., there was a loss of yield of the integrated circuits from the wafer designed to be cut from the back-side surface. As a result, the cost of each of the integrated circuit was increased. However, it is desirable to minimize the cost of each integrated circuit.

SUMMARY OF THE INVENTION

In accordance with the present invention, electronic components of a wafer are delineated by a scribe grid on a front-side surface of the wafer. The scribe grid includes a vertical scribe line and a horizontal scribe line.

A wafer support, e.g., a sticky tape, is adhesively attached to the front-side surface of the wafer to protect the front-side surface during singulation of the wafer. An intersection of the vertical scribe line and the horizontal scribe line is optically recognized through the wafer support, and a drilling device is aligned at the intersection.

The wafer is drilled all the way through at the intersection from the front-side surface to a back-side surface of the wafer with the drilling device to form a back-side alignment mark on the back-side surface of the wafer.

A saw is aligned with the scribe grid using the back-side alignment mark. The wafer is cut from the back-side surface with the saw along the scribe grid to singulate the wafer.

Advantageously, the wafer is cut from the back-side surface and the wafer support protects the front-side surface of the wafer during singulation. Further, since the back-side alignment mark is positioned with respect to the scribe grid to within tight tolerance, the wafer is singulated precisely along the scribe grid. Accordingly, the wafer is not fabricated with the extra large width of scribe lines of conventional wafers designed to be cut from the back-side surface.

In this manner, the electronic components of the wafer are protected during singulation yet are fabricated without the associated substantial increase in cost of the prior art.

These and other features and advantages of the present invention will be more readily apparent from the detailed description set forth below taken in conjunction with the accompanying drawings.

BRIEF DESCRIPTION OF THE DRAWINGS

In the following description, the same or similar elements are labeled with the same or similar reference numbers.

DETAILED DESCRIPTION

In accordance with the present invention, integrated circuits 112 of a wafer 110 (FIG. 1) are delineated by a scribe grid 116 on a front-side surface 110F of wafer 110. Scribe grid 116 includes vertical scribe lines 114 and horizontal scribe lines 115.

A wafer support 204, e.g., a sticky tape, is adhesively attached to front-side surface 110F of wafer 110 (FIG. 4) to protect front-side surface 110F during singulation of wafer 110.

Figure 3:
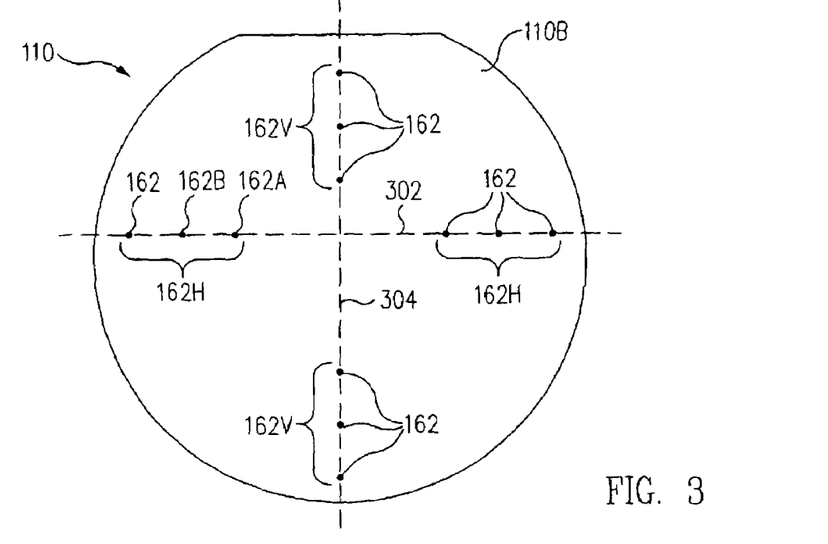
FIG. 3 is a bottom plan view of the wafer of FIG. 1 in accordance with one embodiment of the present invention.

Wafer 110 is drilled all the way through from front-side surface 110F to a back-side surface 110B of wafer 110 with drill bit 502 (FIG. 5) to form back-side alignment marks 162 on back-side surface 110 of wafer 110 (FIG. 3).

A saw 622 (FIGS. 1, 6) is aligned with scribe grid 116 using back-side alignment marks 162. Wafer 110 is cut from back-side surface 110B with saw 622 along scribe grid 116 to singulate wafer 110.

Advantageously, wafer 110 is cut from back-side surface 110B and wafer support 204 protects front-side surface 110F of wafer 110 during singulation. Further, since back-side alignment marks 162 are positioned with respect to scribe grid 116 to within tight tolerance, wafer 110 is singulated precisely along scribe grid 116. Accordingly, wafer 110 is not fabricated with the extra large width of scribe lines of conventional wafers designed to be cut from the back-side surface.

In this manner, integrated circuits 112 of wafer 110 are protected during singulation yet are fabricated without the associated substantial increase in cost of the prior art.

Figure 1:
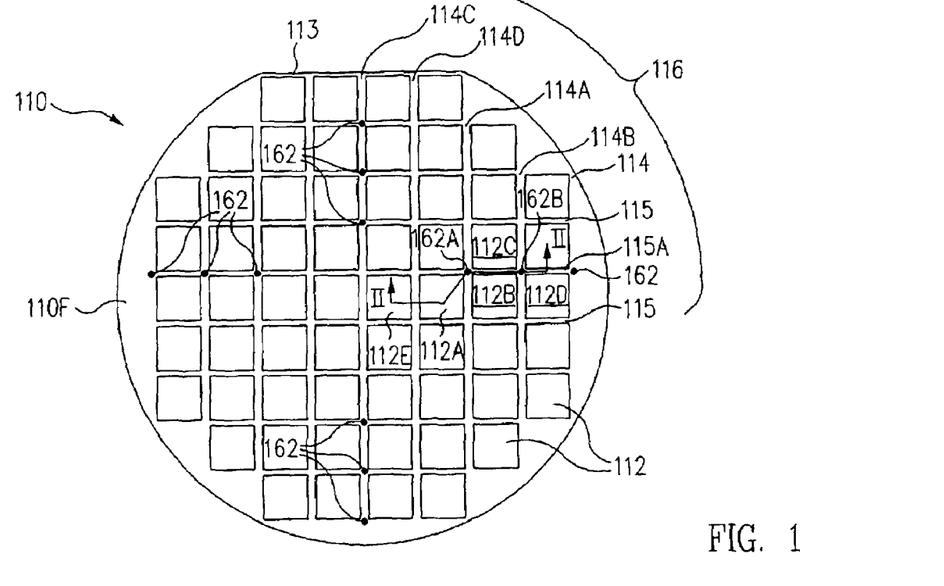
FIG. 1 is a top plan view of a wafer in accordance with one embodiment of the present invention.

More particularly, FIG. 1 is a top plan view of a wafer 110, e.g., a substrate, in accordance with the present invention. Formed in wafer 110 are integrated circuits 112, generally referred to as electronic components. Although integrated circuits 112 are set forth as the electronic components formed in wafer 110, electronic components such as micromachine chips or image sensor chips are formed in wafer 110 instead of integrated circuits 112 in other embodiments. For simplicity, integrated circuits 112 are discussed below and illustrated in the figures.

A scribe grid 116, e.g., a reference feature, on a front-side, e.g., first, surface 110F of wafer 110 delineates integrated circuits 112. For example, scribe grid 116 is a silicon oxide layer, which has been selectively etched, on front-side surface 110F. Integrated circuits 112 include integrated circuits 112A, 112B, 112C, 112D and 112E.

Scribe grid 116 includes a plurality of vertical scribe lines 114 and a plurality of horizontal scribe lines 115, which delineate adjacent integrated circuits 112. Generally, vertical scribe lines 114 extend in a first direction, e.g., vertical in the view of FIG. 1. Further, horizontal scribe lines 115 extend in a second direction perpendicular to the first direction, e.g., horizontal in the view of FIG. 1.

In this embodiment, wafer 110 includes a flat 113, which is a cut straight edge of wafer 110. Flat 113 extends in the second direction, e.g., horizontal in the view of FIG. 1.

A first vertical scribe line 114A of the plurality of vertical scribe lines 114 delineates integrated circuit 112A, e.g., a first integrated circuit 112, from integrated circuit 112B, e.g., a second integrated circuit 112. A first horizontal scribe line 115A of the plurality of horizontal scribe lines 115 delineates integrated circuit 112B from integrated circuit 112C, e.g., a third integrated circuit 112.

Similarly, a second vertical scribe line 114B of the plurality of vertical scribe lines 114 delineates integrated circuit 112B from integrated circuit 112D, e.g., a forth integrated circuit 112.

Formed at the intersection of vertical scribe line 114A and horizontal scribe line 115A is a first back-side alignment mark 162A of a plurality of back-side alignment marks 162 of wafer 110. Similarly, formed at the intersection of vertical scribe line 114B and horizontal scribe line 115A is a second back-side alignment mark 162B of the plurality of back-side alignment marks 162 of wafer 110.

Figure 2:
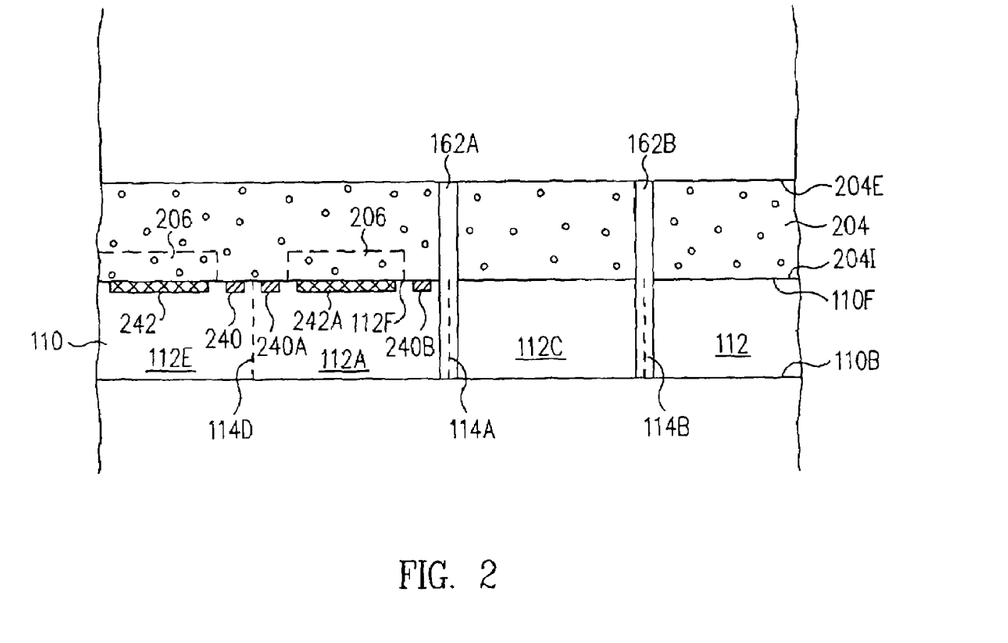
FIG. 2 is a cross-sectional view of the wafer along the line II—II of FIG. 1 in accordance with one embodiment of the present invention.

FIG. 2 is a cross-sectional view of wafer 110 along the line II—II of FIG. 1 in accordance with one embodiment of the present invention. Referring now to FIGS. 1 and 2 together, a wafer support 204 is attached, e.g., adhesively, to front-side surface 110F of wafer 110. More particularly, an adhesive interior, e.g., first, surface 204I of wafer support 204 is attached to front-side surface 110F of wafer 110. Wafer support 204 is not illustrated in FIG. 1 for purposes of clarity.

Illustratively, wafer support 204 is a sticky tape commonly used during wafer singulation as is well known to those of skill in the art. For example, wafer support 204 is a blue or clear sticky tape such as those available from NITTO or LINTEC, respectively, although other supportive materials are used in other embodiments.

Generally, wafer support 204 is sufficiently transparent to allow optical recognition, e.g., by the operator or alignment system, of scribe grid 116 through wafer support 204. Wafer support 204 is a single integral layer or, alternatively, is two or more layers connected together.

In one embodiment, wafer support 204 is ultraviolet radiation (UV) curable. More particularly, upon irradiating wafer support 204 with ultraviolet radiation, wafer support 204 becomes polymerized such that adhesive interior surface 204I of wafer support 204 becomes nonadhesive and is easily detached from front-side surface 110F of wafer 110.

Each integrated circuit 112 includes one or more bond pads 240 on front-side surface 110F. Bond pads 240 are used to form the electrical interconnections with the internal circuitry (not shown) of integrated circuits 112 as is well known to those of skill in the art.

To illustrate, integrated circuit 112A includes a first bond pad 240A and a second bond pad 240B of a plurality of bond pads 240 on a front-side surface 112F of integrated circuit 112A. The other integrated circuits 112 include bond pads 240 in a similar manner so are not discussed further to avoid detracting from the principals of the invention.

In one embodiment, wafer 110 is an image sensor substrate and integrated circuits 112 are image sensor chips, sometimes called optical chips. In accordance with this embodiment, integrated circuits 112 include active areas 242 on front-side surface 110F. To illustrate, integrated circuit 112A includes an active area 242A on front-side surface 112F of integrated circuit 112A. The other integrated circuits 112 include active areas 242 in a similar manner so are not discussed further to avoid detracting from the principals of the invention.

Generally, active areas 242 receive radiation, transmit radiation, or receive and transmit radiation, i.e., are transceivers. Active areas 242 and bond pads 240 are not illustrated in FIG. 1 for purposes of clarity.

In an alternative embodiment, wafer 110 is a micromachine substrate and integrated circuits 112 are micromachine chips, sometimes called microelectromechanical systems (MEMS). In accordance with this embodiment, active areas 242 contain miniature movable structures, sometimes called micromachines. As another alternative, integrated circuits 112 are vertical cavity surface emitting lasers (VCSEL) chips. In light of this disclosure, it is understood that integrated circuits 112 can be a wide variety of electronic components.

In certain applications, it is important to avoid any contact with active areas 242 to avoid damaging or destroying active areas 242, e.g., when integrated circuits 112 are micromachine chips. To prevent wafer support 204 from contacting active areas 242, cavities 206 (indicated in dashed lines) are formed in wafer support 204 and these cavities 206 are aligned above active areas 242. Cavities 206 can be formed using a wide variety of techniques, e.g., such as that set forth in Roberts, Jr. et al., cited above.

As shown in FIG. 2, back-side alignment mark 162A is an aperture extending through wafer support 204, i.e., from an exterior, e.g., second, surface 204E of wafer support 204 to interior surface 204I, and extending through wafer 110, i.e., from front-side surface 110F to a back-side, e.g., second, surface 110B of wafer 110. More generally, back-side alignment mark 162A extends from exterior surface 204E of wafer support 204 to back-side surface 110B of wafer 110. Similarly, back-side alignment mark 162B extends from exterior surface 204E to back-side surface 110B. Back-side alignment marks 162A, 162B are perpendicular to exterior surface 204E, interior surface 204I, front-side surface 110F and back-side surface 110B, which are parallel to one another.

The other back-side alignment marks 162 are similar to back-side alignment marks 162A, 162B and so are not discussed further to avoid detracting from the principals of the invention. Illustratively, back-side alignment marks 162 have a diameter of 0.001 inches (0.0254 millimeters) although back-side alignment marks 162 have other dimensions in other embodiments.

FIG. 3 is a bottom plan view of wafer 110 of FIG. 1 in accordance with this embodiment of the present invention. Referring now to FIGS. 1 and 3 together, back-side alignment marks 162 form a pattern on back-side surface 110B.

Generally, at least one back-side alignment mark 162 is formed, e.g., back-side alignment mark 162A. As discussed further below, back-side alignment mark 162A has a positional relationship to scribe grid 116. Stated another way, the position of back-side alignment mark 162A is related to the position of scribe grid 116 such that by knowing the position of back-side alignment mark 162A the position of scribe grid 116 is readily determined. More particularly, back-side alignment mark 162A is directly aligned with the intersection of vertical scribe line 114A and horizontal scribe line 115A.

In accordance with this embodiment, twelve back-side alignment marks 162 are formed. More particularly, six back-side alignment marks 162H, which form a first set of the plurality of back-side alignment marks 162, are directly aligned with horizontal scribe line 115A. Similarly, six back-side alignment marks 162V, which form a second set of the plurality of back-side alignment marks 162, are directly aligned with a vertical scribe line 114C of the plurality of vertical scribe lines 114.

Stated another way, back-side alignment marks 162H, 162V define horizontal line 302, vertical line 304, respectively. Horizontal line 302 is precisely aligned with horizontal scribe line 115A. Vertical line 304 is precisely aligned with vertical scribe line 114C. Thus, by knowing of the positions of lines 302, 304, the positions of horizontal scribe line 115A, vertical scribe line 114A, respectively, are also precisely known. Advantageously, this allows wafer 110 to be precisely singulated along scribe grid 116 from back-side surface 110B using back-side alignment marks 162 as described further below.

Although twelve back-side alignment marks 162 are illustrated in FIGS. 1 and 3, is understood that more or less than twelve back-side alignment marks 162 are used in other embodiments. For example, in one embodiment, a back-side alignment mark is formed at each intersection of a vertical scribe lines 114 with a horizontal scribe line 115.

Figure 4:
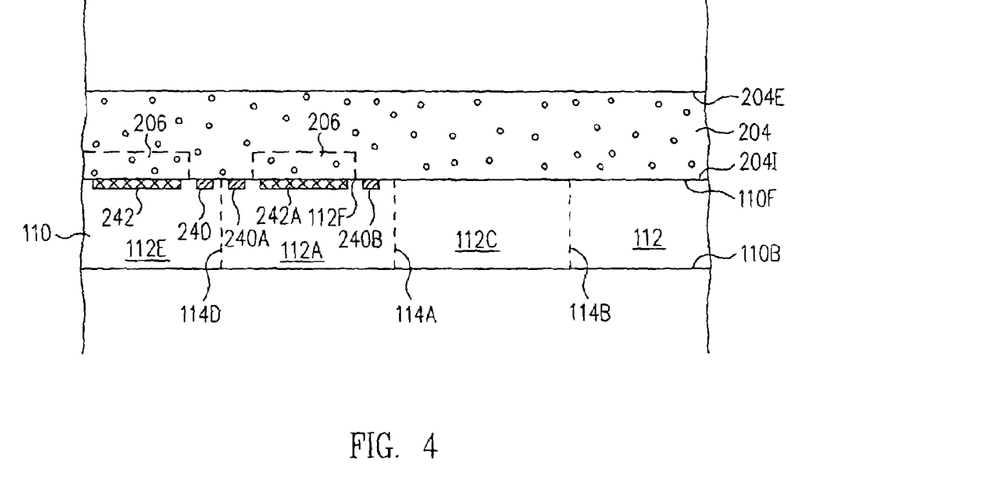
FIG. 4 is a cross-sectional view of the wafer during singulation processing in accordance with one embodiment of the present invention.

FIG. 4 is a cross-sectional view of wafer 110 during singulation processing in accordance with one embodiment of the present invention. FIG. 4 is substantially similar to FIG. 2 and only the significant differences are discussed below.

Referring now to FIG. 4, interior surface 204I of wafer support 204 is adhesively attached to front-side surface 110F of wafer 110.

More generally, wafer support 204 is mounted to wafer 110. In one embodiment, wafer support 204 is mounted to wafer 110 without any alignment. For example, wafer 110 is formed without active areas 242, or, alternatively, active areas 242 can be contacted without causing any damage or destruction. In accordance with these embodiments, wafer support 204 is mounted to wafer 110 without any alignment.

In an alternative embodiment, wafer support 204 is formed with cavities 206 in interior surface 204I. In accordance with this embodiment, wafer support 204 is aligned, e.g., optically or mechanically, with wafer 110 such that cavities 206 are aligned above active areas 242. In the subsequent discussion, wafer support 204 is illustrated without cavities 206 although it is understood that wafer support 204 would include cavities 206 depending upon the particular application.

Figure 5:
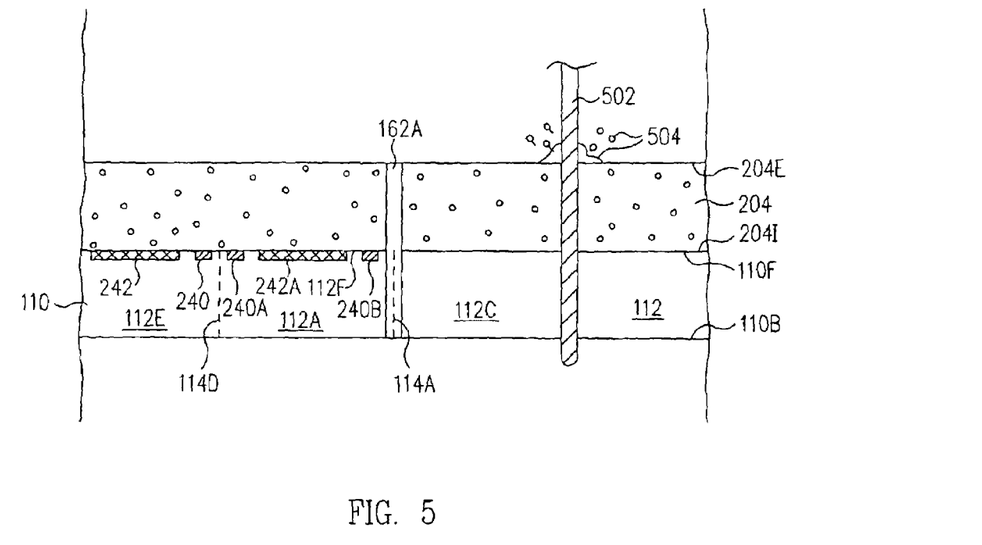
FIG. 5 is a cross-sectional view of the wafer of FIG. 4 at a further stage during singulation processing in accordance with one embodiment of the present invention.

FIG. 5 is a cross-sectional view of wafer 110 of FIG. 4 at a further stage during singulation processing in accordance with this embodiment of the present invention. Referring now to FIG. 5, a drill bit 502 is aligned at a first intersection of particular vertical scribe line 114 and a particular horizontal scribe line 115. Drill bit 502 drills through wafer 110 at the first intersection to form a first back-side alignment mark 162.

To illustrate, referring now to FIGS. 1 and 5 together, drill bit 502 is aligned at the intersection of vertical scribe line 114A and horizontal scribe line 115A. Drill bit 502 drills through wafer 110 from front-side surface 110F to back-side surface 110B at the intersection of vertical scribe line 114A and horizontal scribe line 115A to form back-side alignment mark 162A.

Drill bit 502 is realigned at a second intersection of another particular vertical scribe line 114 and another particular horizontal scribe line 115. Drill bit 502 drills through wafer 110 from front-side surface 110F to back-side surface 110B at the second intersection to form a second back-side alignment mark 162.

To illustrate, referring to FIGS. 1 and 5 together, drill bit 502 is aligned at the intersection of vertical scribe line 114B and horizontal scribe line 115A. Drill bit 502 drills through wafer 110 as shown in FIG. 5 at the intersection of vertical scribe line 114B and horizontal scribe line 115A to form back-side alignment mark 162B. This iterative process is repeated until all back-side alignment marks 162 are formed. Alternatively, a plurality of drill bits 502 are used to form back-side alignment marks 162 simultaneously. In yet other alternative embodiments, instead of drill bit 502, a laser, a high-pressure water drill, or other drilling device is used to form back-side alignment marks 162.

Advantageously, wafer support 204 is sufficiently transparent to allow optical recognition of scribe grid 116, i.e., vertical scribe lines 114 and horizontal scribe lines 115, through wafer support 204. Accordingly, scribe grid 116 is used directly to align drill bit 502 and form back-side alignment marks 162. This allows back-side alignment marks 162 to be formed in precise alignment with scribe grid 116.

Further, wafer support 204 protects front-side surface 110F of wafer 110 during formation of align marks 162. More particularly, wafer support 204 prevents slag and silicon shards 504, i.e., contaminants, generated during formation of back-side alignment marks 162 from contacting front-side surface 110F of wafer 110. In this manner, damage or destruction of integrated circuits 112 is prevented. This, in turn, increases yield, which decreases the fabrication cost of each integrated circuit 112.

In one embodiment, slag and silicon shards 504 are removed using a high-pressure wash immediately after formation of alignment marks 162. Alternatively, slag and silicon shards 504 are removed after subsequent singulation processing described further below.

Figure 6:
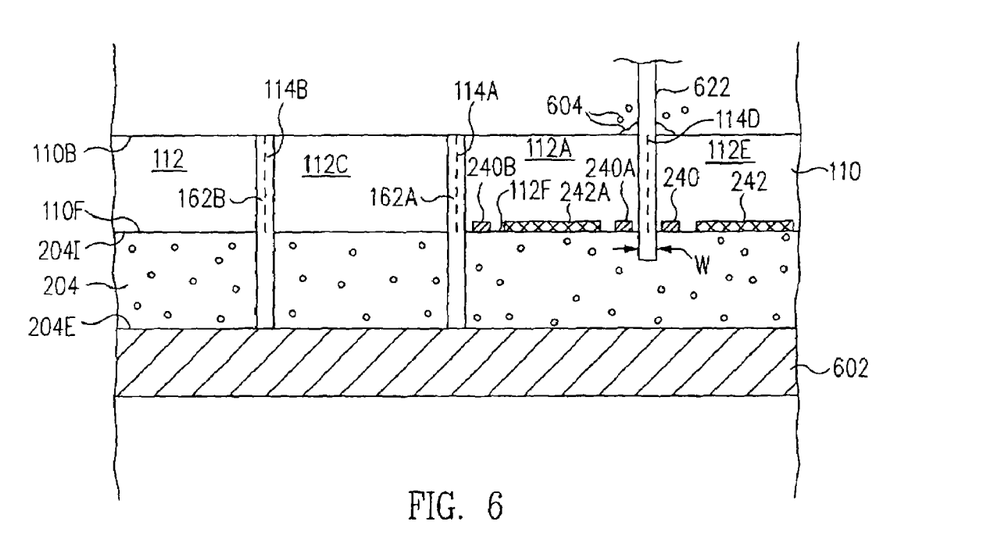
FIG. 6 is a cross-sectional view of the wafer of FIG. 5 at a further stage during singulation processing in accordance with one embodiment of the present invention.

FIG. 6 is a cross-sectional view of wafer 110 of FIG. 5 at a further stage during singulation processing in accordance with this embodiment of the present invention. As shown in FIG. 6, wafer 110 is inverted from the view of FIG. 5. Wafer support 204 is mounted to a sawing chuck 602, e.g., using vacuum in a conventional manner. More particularly, exterior surface 204E of wafer support 204 is mounted to sawing chuck 602.

A saw 622, e.g., the blade of a mechanical saw, is aligned with a vertical scribe line 114D, which delineates integrated circuit 112A from integrated circuit 112E as best shown in FIG. 1. Saw 622 is aligned with vertical scribe line 114D using one or more back-side alignment marks 162 (hereinafter referred to as back-side alignment mark 162 for simplicity) as a reference, e.g., see back-side alignment marks 162 of FIG. 3. In one embodiment, light is shined at an angle to back-side surface 110B to enhance the contrast between alignment mark 162 and the bulk of back-side surface 110B to enhance recognition of alignment mark 162.

More particularly, the position of vertical scribe line 114D is determined from back-side alignment mark 162 and this information is used to align saw 622 with vertical scribe line 114D. For example, an optical or mechanical alignment system, which is well known to those of skill in the art, aligns saw 622 with vertical scribe line 114D using back-side alignment mark 162 as a reference.

Since back-side alignment mark 162 is positioned with respect to vertical scribe line 114D to within tight tolerance, e.g., to within 0.001 in. (0.025 mm) or less, saw 622 is precisely aligned to vertical scribe line 114D. Wafer 110 is cut from back-side surface 110B along vertical scribe line 114D with saw 622. Although cutting of wafer 110 with saw 622, e.g., the blade of a mechanical saw, is described, in light of this disclosure, it is understood that other techniques for cutting wafer 110 can be used, e.g., laser cutting or high-pressure water cutting. Generally, the term saw 622 as used herein includes a mechanical saw, a laser saw and a high-pressure water saw as well as other comparable saws.

Advantageously, saw 622 is precisely aligned to vertical scribe line 114D such that wafer 110 is precisely cut along vertical scribe line 114D. Since wafer 110 is precisely cut along vertical scribe line 114D, vertical scribe line 114D is not fabricated with the extra large width of scribe lines of conventional wafers designed to be cut from the back-side surface. Accordingly, vertical scribe line 114D is relatively narrow and has a narrow width W.

In one embodiment, width W of vertical scribe line 114D is the same as the width of a scribe line of a wafer, which was designed to be cut from the front-side surface of the wafer. For example, width W is in the range of approximately 0.002 inches (0.051 mm) to 0.008 inches (0.203 mm) and in one particular embodiment is within the range of 0.002 inches (0.051 mm) to 0.003 inches (0.076 mm) or less although width W has other dimensions in other embodiments.

Although cutting of wafer 110 from back-side surface 110B along vertical scribe line 114D is described above, in light of this disclosure, those of skill in the art will understand that wafer 110 is cut along scribe lines 114 and 115 (FIG. 1), i.e., along scribe grid 116, using back-side alignment mark 162 as a reference in a similar manner to that described above with regard to vertical scribe line 114D. Saw 622 cuts wafer 110 from back-side surface 110B along scribe grid 116 thus singulating integrated circuits 112.

More particularly, after sawing of the particular singulation street 114 (or 115), wafer 110 is stepped, i.e., moved a fixed distance, such that saw 622 is precisely aligned with the adjacent singulation street 114 (or 115). The adjacent singulation street 114 (or 115) is then sawed. This iterative process is repeated until all of singulation streets 114 (or 115) are sawed. Wafer 110 is then rotated 90°.

After rotation of wafer 110, another particular singulation street 115 (or 114) of the plurality of singulation streets 115 (or 114) is sawed. After sawing of the particular singulation street 115 (or 114), wafer 110 is stepped, i.e., moved a fixed distance, such that saw 622 is precisely aligned with the adjacent singulation street 115 (or 114). The adjacent singulation street 115 (or 114) is then sawed. This iterative process is repeated until all of singulation street 115 (or 114) are sawed and wafer 110 is singulated.

Advantageously, wafer 110 is cut from back-side surface 110B thus protecting front-side surface 110F of wafer 110. More particularly, wafer support 204 prevents slag and silicon shards 604, i.e., contaminants, generated during singulation of wafer 110 from contacting front-side surface 110F of wafer 110. In this manner, damage or destruction of integrated circuits 112 is prevented. This, in turn, increases yield, which decreases the fabrication cost of each integrated circuit 112.

Of further importance, width W of scribe lines 114, 115 is significantly less than that of conventional wafers designed to be cut from the back-side surface.

Recall that in the prior art, in certain instances, it was important to cut the wafer from the back-side surface. However, to accommodate the large tolerance associated with back-side wafer cutting, the wafer designed to be cut from the back-side surface was formed with relatively wide scribe lines. Disadvantageously, forming the scribe lines with a relatively large width resulted in less integrated circuits for any given size wafer, i.e., a loss of yield. This resulted in a substantial increase in the cost of the integrated circuits in the prior art.

In stark contrast, wafer 110 is cut from back-side surface 110B without the associated loss of yield of the prior art. As a result, integrated circuits 112 of wafer 110 are protected during singulation yet are fabricated without the associated substantial increase in cost of the prior art.

Figure 7:
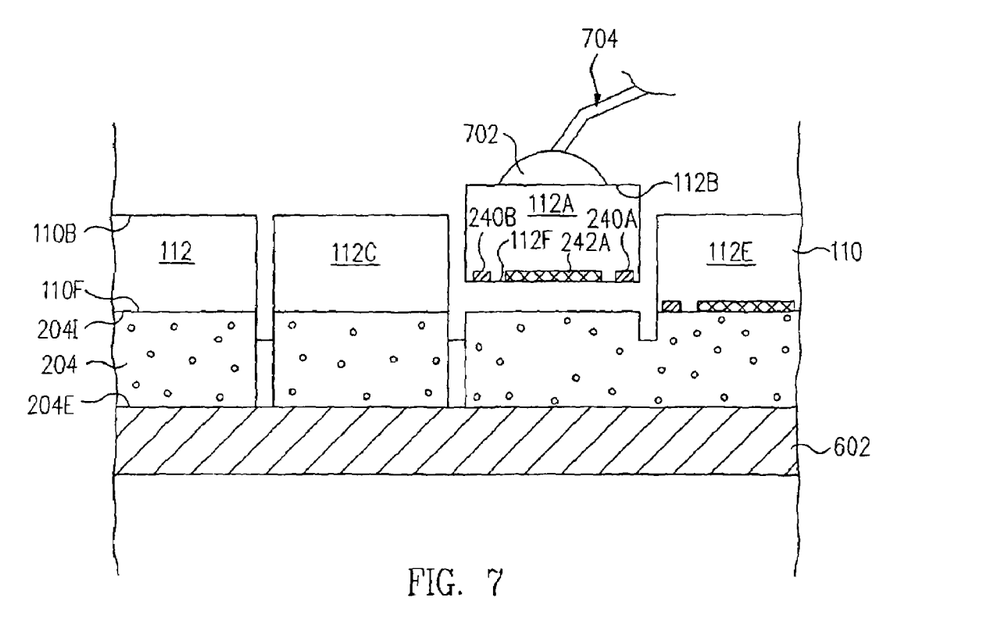
FIG. 7 is a cross-sectional view of the wafer of FIG. 6 at a further stage during singulation processing in accordance with one embodiment of the present invention.

FIG. 7 is a cross-sectional view of wafer 110 of FIG. 6 at a further stage during singulation processing in accordance with this embodiment of the present invention. Referring now FIG. 7, after singulation of wafer 110, wafer 110 is high pressure washed to remove any slag and silicon shards 604

(FIG. 6) generated during singulation of wafer 110. A vacuum pickup head 702 of a pick and place machine 704 attaches to back-side surface 112B of integrated circuit 112A, and more generally to back-side surface 110B of wafer 110. Pick and place machine 704 removes integrated circuit 112A from wafer support 204. Integrated circuit 112A is either packaged for shipment or further processed as is well known to those of skill in the art. The other integrated circuits 112 are similarly removed from wafer support 204 by pick and place machine 704.

Advantageously, after being removed from wafer support 204, front-side surfaces 112F of integrated circuits 112, and, more generally, front-side surface 110F of wafer 110, is clean and free from slag and silicon shards.

In one embodiment, integrated circuits 112 are flipped over after being removed from wafer support 204 and placed for die attach and wirebonding. Die attach and wirebonding of integrated circuits are well known to those of skill in the art is not discussed further to avoid detracting from the principals of the invention.

In one embodiment, wafer support 204 is UV curable. In accordance with this embodiment, wafer support 204 is irradiated with ultraviolet radiation to polymerize wafer support 204 and render interior surface 204I nonadhesive. Accordingly, integrated circuits 112 lose the adhesive mounting to wafer support 204 thus facilitating removal of integrated circuits 112 from wafer support 204.

This application is related to Glenn et al., co-filed and commonly assigned U.S. patent application Ser. No. 09/803, 083 entitled "BACK-SIDE WAFER SINGULATION METHOD", which is herein incorporated by reference in its entirety.

The drawings and the forgoing description gave examples of the present invention. The scope of the present invention, however, is by no means limited by these specific examples. Numerous variations, whether explicitly given in the specification or not, such as differences in structure, dimension, and use of material, are possible. The scope of the invention is at least as broad as given by the following claims.

What is claimed is:

1. A wafer comprising:
   a first surface;
   a second surface;
   a first scribe line coupled to said first surface, said first scribe line extending in a first direction;
   a second scribe line coupled to said first surface, said second scribe line extending in a second direction perpendicular to said first direction; and
   a first alignment mark formed at an intersection of said first scribe line and said second scribe line, said first alignment mark extending from said first surface to said second surface.

2. The wafer of claim 1 further comprising a scribe grid comprising said first scribe line and said second scribe line.

3. The wafer of claim 2 further comprising electronic components delineated by said scribe grid.

4. The wafer of claim 3 wherein said electronic components are selected from the group consisting of integrated circuits, micromachine chips and image sensor chips.

5. The wafer of claim 3 wherein said electronic components comprise bond pads coupled to said first surface.

6. The wafer of claim 3 wherein said electronic components comprise active areas coupled to said first surface.

7. The wafer of claim 1 further comprising a flat extending in said second direction.

8. The wafer of claim 1 wherein said first scribe line delineates a first electronic component from a second electronic component.

9. The wafer of claim 8 wherein said second scribe line delineates said second electronic component from a third electronic component.

10. The wafer of claim 1 wherein said first alignment mark is an aperture.

11. The wafer of claim 1 further comprising a first plurality of alignment marks comprising said first alignment mark, said first plurality of alignment marks extending from said first surface to said second surface.

12. The wafer of claim 11 wherein said first plurality of alignment marks are aligned with said first scribe line.

13. The wafer of claim 12 further comprising a second plurality of alignment marks aligned with a third scribe line coupled to said first surface and extending in said second direction.

14. The wafer of claim 11 wherein said first plurality of alignment marks define a first line, said first line being aligned with said first scribe line.

15. The wafer of claim 14 further comprising a second plurality of alignment marks defining a second line, said second line being aligned with a third scribe line coupled to said first surface and extending in said second direction.

16. A wafer comprising:
   a first surface;
   a second surface;
   a scribe grid coupled to said first surface; and
   a plurality of alignment marks extending from said first surface to said second surface, said plurality of alignment marks having a positional relationship to said scribe grid.

17. The wafer of claim 16 wherein said scribe grid comprises a horizontal scribe line, a first set of said plurality of alignment marks being aligned with said horizontal scribe line.

18. The wafer of claim 17 wherein said scribe grid comprises a vertical scribe line, a second set of said plurality of alignment marks being aligned with said vertical scribe line.

19. The wafer of claim 2 wherein said scribe grid comprises an etched silicon oxide layer.

20. The wafer of claim 16 wherein said scribe grid comprises an etched silicon oxide layer.

21. The wafer of claim 16 further comprising electronic components delineated by said scribe grid.

22. The wafer of claim 16 wherein said electronic components are selected from the group consisting of integrated circuits, micromachine chips and image sensor chips.

23. The wafer of claim 16 wherein said electronic components comprise bond pads coupled to said first surface.

24. The wafer of claim 16 wherein said electronic components comprise active areas coupled to said first surface.

25. The wafer of claim 18 wherein said vertical scribe line extends in a first direction and wherein said horizontal scribe line extends in a second direction, said wafer further comprising a flat extending in said second direction.

26. A wafer comprising:
   a front-side surface;
   a back-side surface;
   a first scribe line coupled to said front-side surface; and
   a first back-side alignment mark extending from said front-side surface to said back-side surface, said first back-side alignment mark being formed along said first scribe line.

27. The wafer of claim 26 further comprising a plurality of back-side alignment marks extending from said front-side surface to said back-side surface, said plurality of back-side alignment marks comprising said first back-side alignment mark.

28. The wafer of claim 27 wherein said plurality of back-side alignment marks have a positional relationship to said first scribe line.

29. The wafer of claim 1 wherein said first alignment mark provides a means for determining a position of said scribe line from said second surface.

30. The wafer of claim 1 wherein said first alignment mark is for aligning a saw with said wafer.

* * * * *

UNITED STATES PATENT AND TRADEMARK OFFICE
CERTIFICATE OF CORRECTION

| | | |
|---|---|---|
| PATENT NO. | : 6,943,429 B1 | Page 1 of 1 |
| APPLICATION NO. | : 09/803084 | |
| DATED | : September 13, 2005 | |
| INVENTOR(S) | : Thomas P. Glenn, Roy Dale Hollaway and Steven Webster | |

It is certified that error appears in the above-identified patent and that said Letters Patent is hereby corrected as shown below:

In Claim 22, at Column 10, Line 48, change "claim 16" to --claim 21--.
In Claim 23, at Column 10, Line 51, change "claim 16" to --claim 21--.
In Claim 24, at Column 10, Line 53, change "claim 16" to --claim 21--.

Signed and Sealed this

Twenty-first Day of November, 2006

JON W. DUDAS
*Director of the United States Patent and Trademark Office*